United States Patent
Huang et al.

(10) Patent No.: US 10,349,518 B1
(45) Date of Patent: Jul. 9, 2019

(54) CIRCUIT BOARD AND METHOD FOR MANUFACTURING THE SAME

(71) Applicants: HongQiSheng Precision Electronics (QinHuangDao) Co.,Ltd., Qinhuangdao (CN); Avary Holding (Shenzhen) Co., Limited., Shenzhen (CN)

(72) Inventors: Han-Pei Huang, New Taipei (TW); Yong-Chao Wei, Qinhuangdao (CN)

(73) Assignees: HongQiSheng Precision Electronics (QinHuangDao) Co., Ltd., Qinhuangdao (CN); Avary Holding (Shenzhen) Co., Limited., Shenzhen (CN)

( * ) Notice: Subject to any disclaimer, the term of this patent is extended or adjusted under 35 U.S.C. 154(b) by 0 days.

(21) Appl. No.: 16/145,220

(22) Filed: Sep. 28, 2018

(30) Foreign Application Priority Data

Aug. 1, 2018 (CN) .......................... 2018 1 0860131

(51) Int. Cl.
| | |
|---|---|
| H05K 1/02 | (2006.01) |
| H05K 1/05 | (2006.01) |
| H05K 1/18 | (2006.01) |
| H05K 3/32 | (2006.01) |
| H05K 1/09 | (2006.01) |
| H05K 1/03 | (2006.01) |
| H05K 1/11 | (2006.01) |

(52) U.S. Cl.
CPC ......... *H05K 1/0298* (2013.01); *H05K 1/0393* (2013.01); *H05K 1/05* (2013.01); *H05K 1/09* (2013.01); *H05K 1/115* (2013.01); *H05K 1/186* (2013.01); *H05K 3/321* (2013.01)

(58) Field of Classification Search
CPC ........ H05K 1/0298; H05K 1/115; H05K 1/09; H05K 1/0393; H05K 1/186; H05K 1/05; H05K 3/321
USPC .......................................................... 174/250
See application file for complete search history.

(56) References Cited

U.S. PATENT DOCUMENTS

| | | | | |
|---|---|---|---|---|
| 2012/0160550 A1* | 6/2012 | Jeong | ................. | H01L 23/5389 174/257 |
| 2014/0182892 A1* | 7/2014 | Hsu | ........................ | H05K 1/186 174/251 |
| 2016/0066431 A1* | 3/2016 | Samejima | .............. | H05K 3/445 29/829 |

\* cited by examiner

*Primary Examiner* — Sherman Ng
(74) *Attorney, Agent, or Firm* — ScienBiziP, P.C.

(57) ABSTRACT

A method of manufacturing an embedded circuit board includes: a first adhesive coated copper is provided, which includes a first copper layer pre-formed with at least two first positioning holes and a first adhesive layer formed on a surface of the first copper layer; at least one first electronic element are adhered to the first adhesive layer, electrodes of the first electronic element face their corresponding first positioning hole; a second adhesive coated copper and a semi-cured film are provided, the first adhesive coated copper and the second adhesive coated copper are pressed on opposite surfaces of the semi-cured film, thereby embedding the first electronic elements in the semi-cured film; the first adhesive layer is partially removed to define first holes for exposing electrodes of the first electronic element; the electrodes are electrically connected with the first copper layer. A circuit board made by the method is also provided.

16 Claims, 9 Drawing Sheets

CIRCUIT BOARD AND METHOD FOR MANUFACTURING THE SAME

FIELD

The subject matter herein generally relates to circuit boards, and particularly relates to a circuit board and method for manufacturing the embedded circuit board.

BACKGROUND

Electronic elements (such as resistance, capacitance, and so on) of a flexible printed circuit board are embedded in the flexible printed circuit board, so that a thickness of the flexible printed circuit board is reduced, as well as reducing a thickness of an electronic product having the flexible printed circuit board.

The traditional conductive structures of embedded circuit board mainly include Pad conduction type and Via conduction type. In these two types of conductive structures, the electronic elements are usually firstly placed in an insulating dielectric material or a metal conductor layer, and then embedded in the substrate in a press-fit manner. However, for the materials and processes of constructing flexible circuit boards, the traditional embedding methods have limitations and process bottlenecks. First, material shrinkage is difficult to control, resulting in poor alignment accuracy of the electronic elements. Second, because the material of flexible printed circuit boards is thin, the electronic elements may be damaged during pressing, thereby affecting the function of the product.

Therefore, there is room for improvement within the art.

BRIEF DESCRIPTION OF THE DRAWINGS

Implementations of the present technology will now be described, by way of only, with reference to the attached figures.

DETAILED DESCRIPTION

Figure 1:
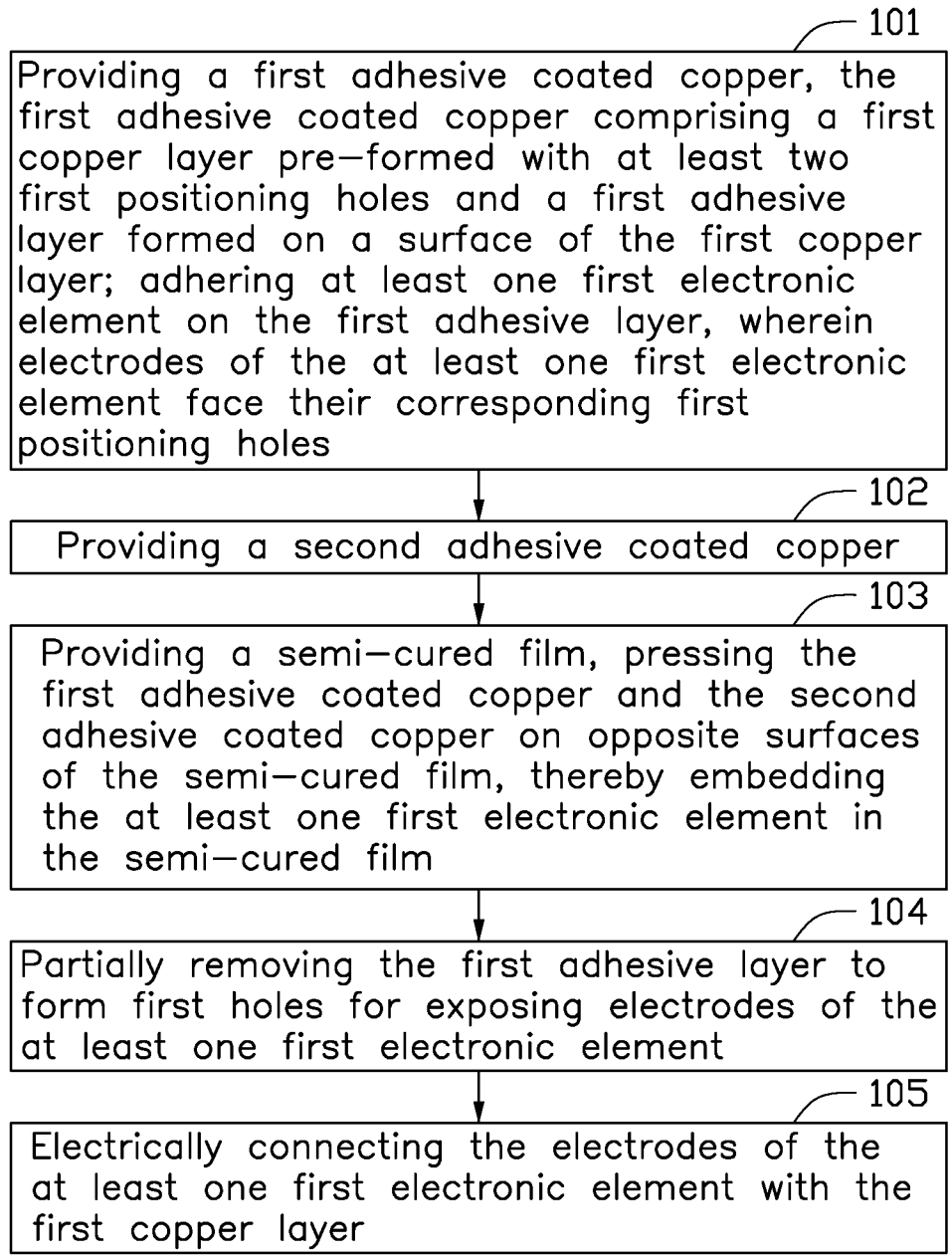
FIG. 1 is a flowchart of a method for manufacturing an embedded circuit board according to a first embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series and the like.

FIG. 1 shows a flowchart for a method of manufacturing an embedded circuit board 100 in accordance with a first embodiment. The method is provided by way of example, as there are a variety of ways to carry out the method. The method described below can be carried out using the configurations shown in FIGS. 2-9, for example, and various elements of these figures are referenced in explaining the method. Each block shown in FIG. 1 represents one or more processes, methods, or subroutines, carried out in the method. Furthermore, the shown order of blocks is illustrative only and the order of the blocks can change. Additional blocks can be added or fewer blocks may be utilized, without departing from this disclosure. The example method can begin at block S101.

Figure 2:
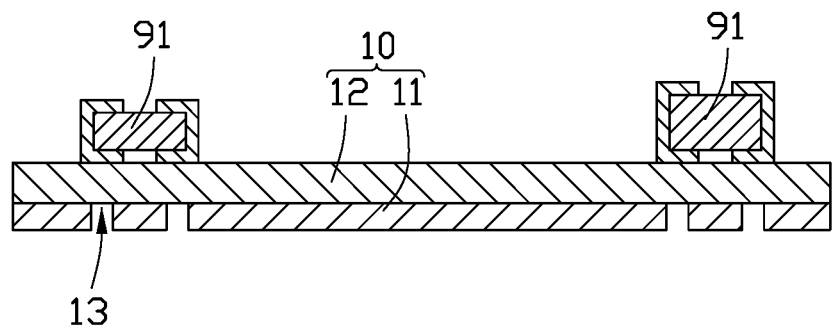
FIG. 2 shows a cross sectional view of a first adhesive coated copper used in the method of manufacturing the embedded circuit board of FIG. 1.

At block S101, as shown in FIG. 2, a first adhesive coated copper 10 includes a first copper layer 11 and a first adhesive layer 12. The first copper layer 11 is pre-formed with at least two first positioning holes 13. The first adhesive layer 12 is formed on a surface of the first copper layer 11. At least one first electronic element 91 are adhered to the first adhesive layer 12, and the electrodes of the at least one first electronic element 91 face their corresponding first positioning holes 13.

A thickness of the first copper layer 11 is selected according to the copper thickness specification of the line process. Typically, the thickness of the first copper layer 11 is less than or equal to 3 µm.

The first adhesive layer 12 is insulated and made of a viscous resin. The viscous resin of the first adhesive layer 12 may be at least one of Polypropylene, epoxy, polyurethane, phenolic, urea-formaldehyde, melamine-ormaldehyde and polyimide.

Figure 3:
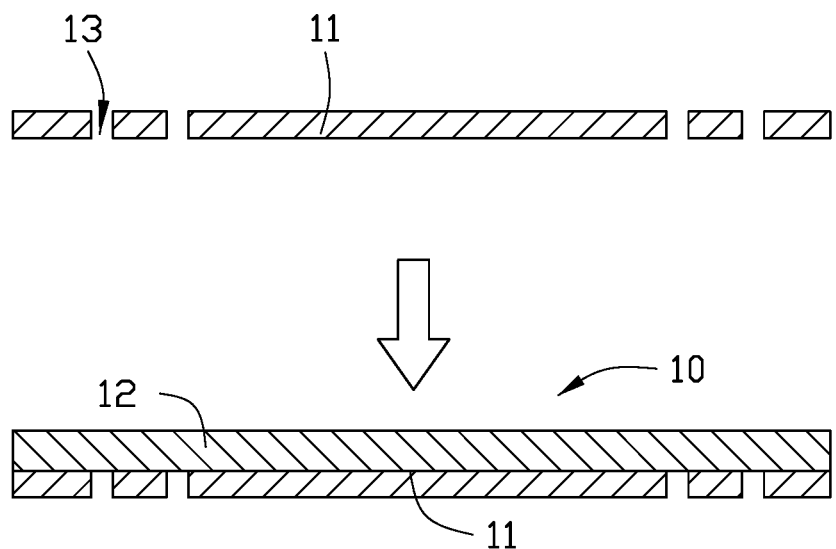
FIG. 3 and FIG. 4 show a cross sectional view for manufacturing the first adhesive coated copper of FIG. 2.
Figure 4:
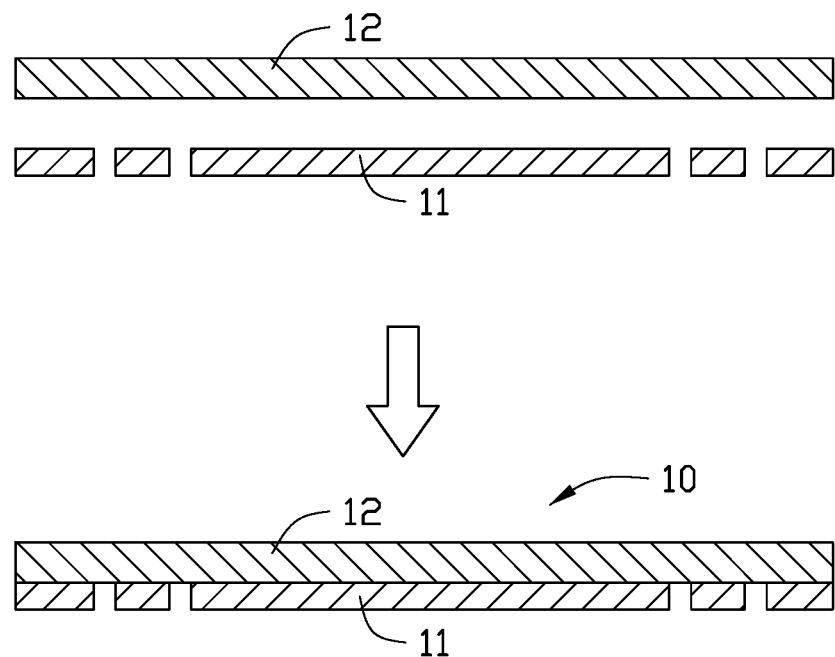

As shown in FIG. 3, a fabrication of the first adhesive coated copper 10 includes: providing the first copper layer 11 pre-formed with at least two first positioning holes 13; applying colloids on one surface of the first copper layer 11 to form the first adhesive layer 12.

Alternatively, the fabrication of the first adhesive coated copper 10 includes: providing the first copper layer 11 pre-formed with at least two first positioning holes 13; providing the semi-cured first adhesive layer 12, and fitting and pressing the semi-cured first adhesive layer 12 on the first copper layer 11.

The first positioning holes 13 are defined in the first copper layer 11 by an image transfer method. The first positioning holes 13 are used not only for positioning the first electronic element 91 but also for conducting a high density line. The diameter of the first positioning hole 13 is selected according to that the size of an electrode of the embedded first electronic element 91. The number of the first positioning holes 13 is equal to the total number of electrodes of the first electronic element 91. After, as described below, the first electronic element 91 is fixed on the first adhesive layer 12, each electrode of the first electronic element 91 corresponds to one of the first positioning holes 13. In this embodiment, the number of the first electronic elements 91 is two, and the total number of the electrodes of the first electronic elements 91 is four, and correspondingly, the first copper layer 11 is pre-configured with four first positioning holes 13.

Figure 5:
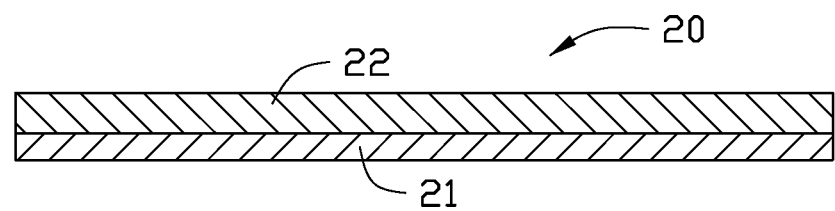
FIG. 5 shows a cross sectional view of a second adhesive coated copper used in the method of manufacturing the embedded circuit board of FIG. 1.

At block S102, as shown in FIG. 5, a second adhesive coated copper 20 is provided.

The second adhesive coated copper 20 includes a second copper layer 21 and a second adhesive layer 22 formed on a surface of the second copper layer 21.

In the first embodiment, the second copper layer 21 is a plates. A thickness of the second copper layer 21 is selected according to the copper thickness specification of the line process. In an embodiment, the thickness of the second copper layer 21 is less than or equal to 3 µm.

The second adhesive layer 22 is insulated and made of a viscous resin. The viscous resin of the second adhesive layer 22 may be at least one of Polypropylene, epoxy, polyurethane, phenolic, urea-formaldehyde, melamine-ormaldehyde and polyimide. In the first embodiment, the viscous resin of the second adhesive layer 22 is the same as the viscous resin of the first adhesive layer 12.

Fabricating the second adhesive coated copper 20 is similar to fabricating of the first adhesive coated copper 10. Specifically, the fabrication of the second adhesive coated copper 20 includes: providing the second copper layer 21; applying colloids on one surface of the second copper layer 21 to form the second adhesive layer 22. Alternatively, the fabrication of the second adhesive coated copper 20 includes: providing the second copper layer 21; providing the semi-cured second adhesive layer 22, and fitting and pressing the semi-cured second adhesive layer 22 on the second copper layer 21.

Figure 6:
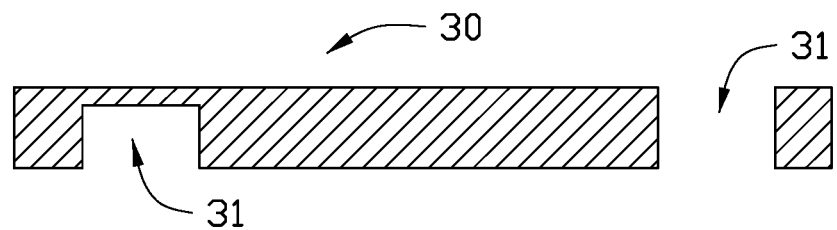
FIG. 6 shows a cross sectional view of a semi-cured film used in the method of manufacturing the embedded circuit board of FIG. 1.
Figure 7:
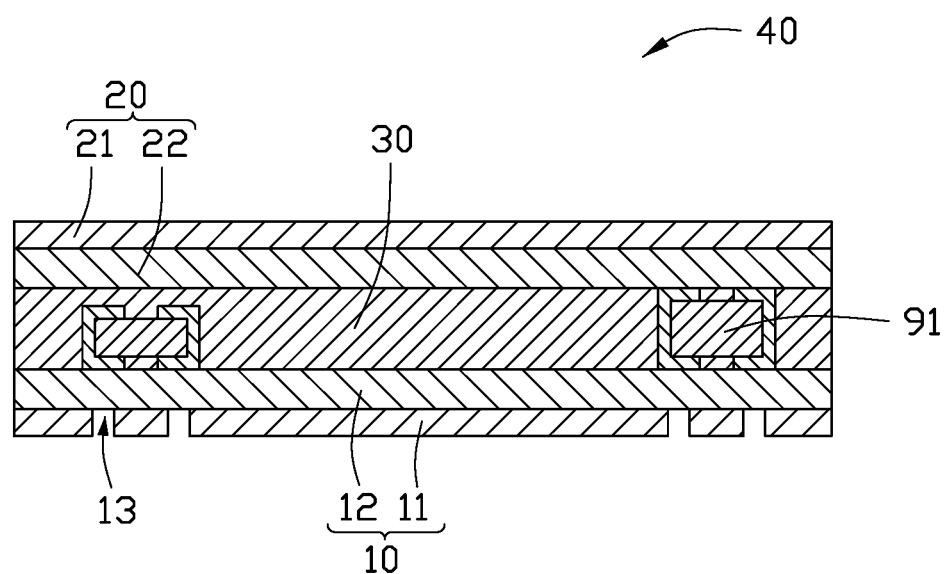
FIG. 7 shows a cross sectional view of an embedded body obtained by fitting the second adhesive coated copper of FIG. 5 and the first adhesive coated copper of FIG. 2 on the semi-cured film of FIG. 6.

At block S103, as shown in FIG. 6 and FIG. 7, a semi-cured film 30 is provided, the first adhesive coated copper 10 and the second adhesive coated copper 20 are pressed on opposite surfaces of the semi-cured film 30, thereby the first electronic elements 91 being embedded in the semi-cured film 30 to obtain an embedded body 40.

A thickness of the semi-cured film 30 is selected according to an actual thickness of the first electronic element 91.

The semi-cured film 30 is made of, but not limited to, polyimide (PI), liquid crystal polymer (LCP), polyethylene terephthalate (PET), or Polyethylene Naphthalate (PEN).

When the first electronic element 91 is thin, the first adhesive coated copper 10 is directly pressed on the semi-cured film 30 to embed the first electronic element 91 in the semi-cured film 30. When the thickness of the first electronic element 91 is large, the step S103 further includes: defining at least one groove 31 on the semi-cured film 30 for receiving and embedding the first electronic element 91.

Because different first electronic elements 91 have different thicknesses, the depths of each of the grooves 31 may also be different. The grooves 31 may be a cavity (not penetrating entirely through the semi-cured film 30) or an opening (penetrating entirely through the semi-cured film 30) according to the thickness of the elements to be embedded therein.

During the pressing processes, after the first electronic element 91 is positioned, the bonding process of the semi-cured film 30 can be controlled for improving a flatness of the embedded circuit board 100 and reducing a thickness of the embedded circuit board 100.

Figure 8:
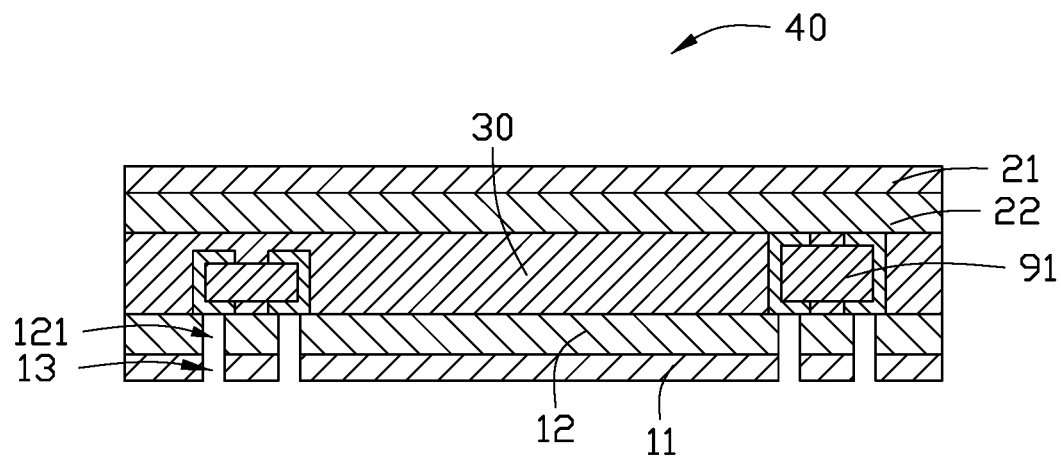
FIG. 8 shows a cross sectional view of the embedded body of FIG. 7, after partially removing a first adhesive layer.

At block S104, as shown in FIG. 8, the first adhesive layer 12 is partially removed to define first holes 121 for exposing electrodes of the first electronic element 91.

Specifically, portions of the first adhesive layer 12 corresponding to the locations of the first positioning holes 13 are laser etched away to expose the electrodes of the first electronic element 91. In other words, each of the first holes 121 faces their corresponding first positioning holes 13 and are in communication therewith.

Figure 9:
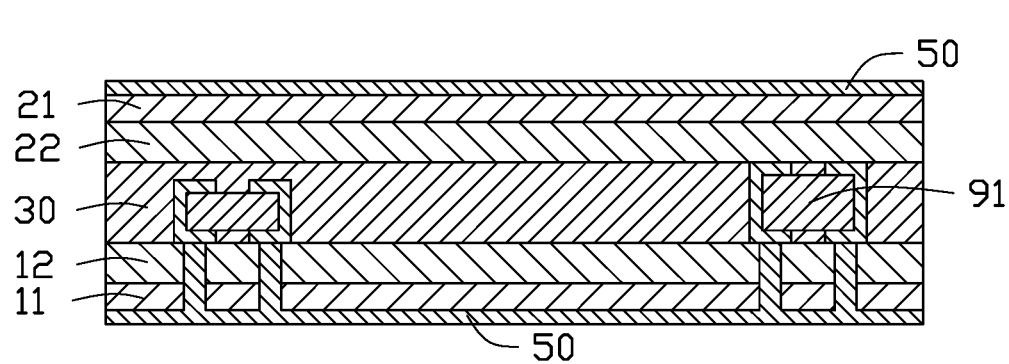
FIG. 9 shows a cross sectional view of the embedded circuit board manufactured using the method of FIG. 1.

At block S105, as shown in FIG. 9, the electrodes of the at least one first electronic element 91 are electrically connected with the first copper layer 11.

Specifically, the embedded body 40 is plated to form a plating layer 50 thereon. The plating layer 50 coats the embedded body 40 and fills the first holes 121 and the first positioning holes 13 to achieve an external connection of the embedded circuit board 100.

Furthermore, in FIG. 9, the embedded circuit board 100 of the first embodiment includes a first adhesive coated copper 10, a second adhesive coated copper 20, a semi-cured film 30, and a plating layer 50. The first adhesive coated copper 10 and the second adhesive coated copper 20 are fit on opposite surfaces of the semi-cured film 30 to form an embedded body 40. The plating layer 50 completely coats the embedded body 40.

The first adhesive coated copper 10 includes a first copper layer 11 and a first adhesive layer 12 formed on a surface of the first copper layer 11. The first copper layer 11 is fit on the semi-cured film 30 by the first adhesive layer 12.

At least two first positioning holes 13 are defined on the first copper layer 11. At least one first electronic element 91 is provided and adhered to the first adhesive layer 12. Electrodes of the at least one first electronic element 91 face their corresponding first positioning holes 13.

At least two first holes 121 are defined in the first adhesive layer 12. Each of the first holes 121 faces their corresponding first positioning holes 13 and are in communication therewith, to expose electrodes of the first electronic element 91.

A thickness of the first copper layer 11 is selected according to the copper thickness specification of the line process. In an embodiment, the thickness of the first copper layer 11 is less than or equal to 3 µm.

The first adhesive layer 12 is insulated and made of a viscous resin. The viscous resin of the first adhesive layer 12 may be at least one of Polypropylene, epoxy, polyurethane, phenolic, urea-formaldehyde, melamine-ormaldehyde and polyimide.

The second adhesive coated copper 20 includes a second copper layer 21 and a second adhesive layer 22 formed on a surface of the second copper layer 21. The second copper layer 21 is fit on the semi-cured film 30 by the second adhesive layer 22. In the first embodiment, the second copper layer 21 is a plate. A thickness of the second copper layer 21 is selected according to the copper thickness specification of the line process. In an embodiment, the thickness of the second copper layer 21 is less than or equal to 3 µm.

The second adhesive layer 22 is insulated and is made of a viscous resin. The viscous resin of the second adhesive layer 22 may be at least one of Polypropylene, epoxy, polyurethane, phenolic, urea-formaldehyde, melamine-ormaldehyde and polyimide. In the first embodiment, the viscous resin of the second adhesive layer 22 is the same as the viscous resin of the first adhesive layer 12.

A thickness of the semi-cured film 30 is selected according to an actual thickness of the first electronic element 91. The semi-cured film 30 is made of, but not limited to, polyimide (PI), liquid crystal polymer (LCP), polyethylene terephthalate (PET), or Polyethylene Naphthalate (PEN).

At least one groove 31 is defined in the semi-cured film 30 for receiving and embedding the first electronic element 91. Because different first electronic elements 91 have different thicknesses, the depths of the grooves 31 are also different. The groove 31 may be a cavity (not penetrating entirely through the semi-cured film 30) or an opening (penetrating entirely through the semi-cured film 30) according to the thickness of the elements to be embedded therein.

The plating layer 50 coats the embedded body 40 and fills the first holes 121 and the first positioning holes 13 to achieve an external connection of the embedded circuit board 100.

Figure 10:
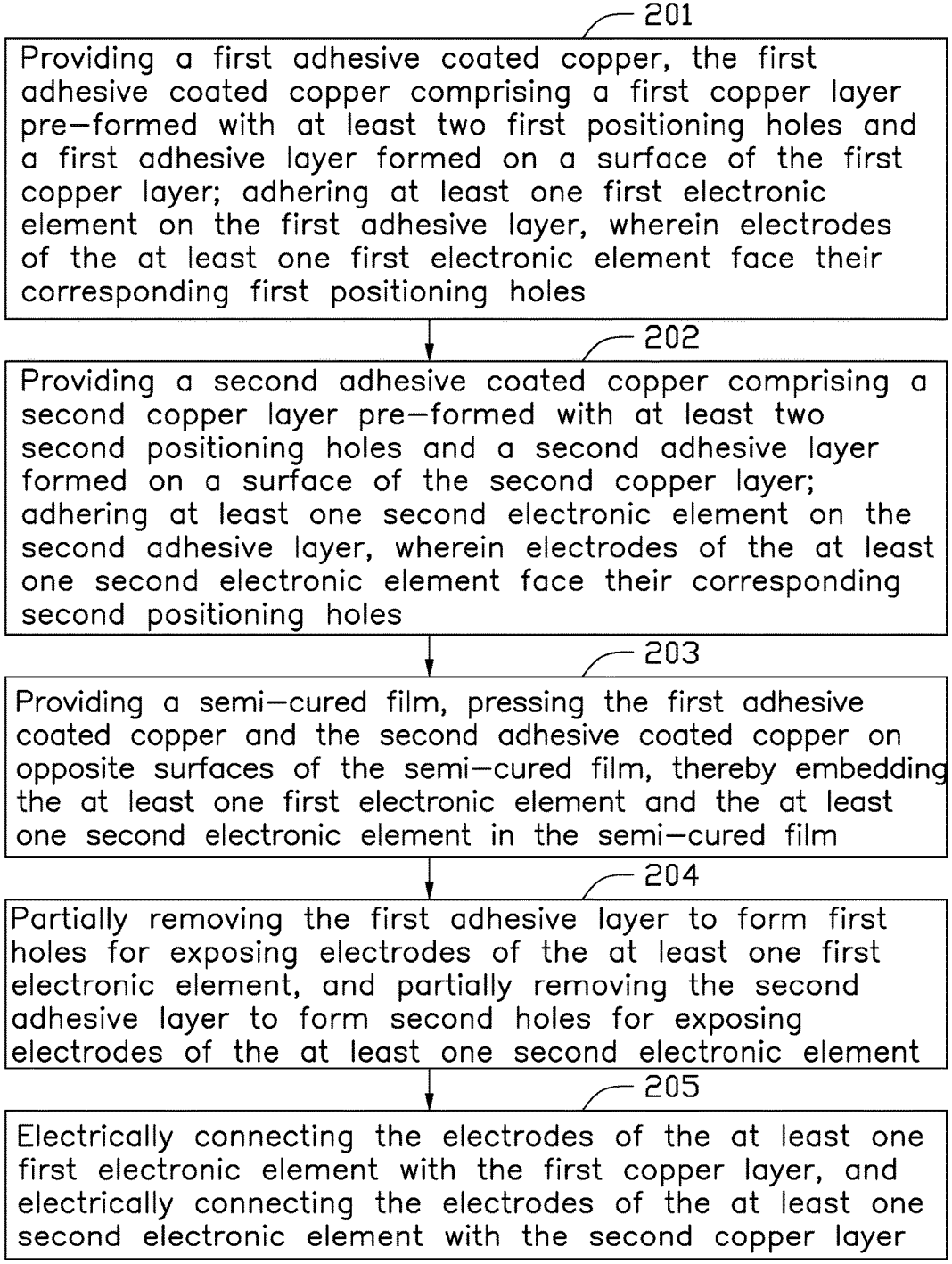
FIG. 10 is a flowchart of a method for manufacturing an embedded circuit board according to a second embodiment.

FIG. 10 shows a flowchart for a second embodiment of a method of manufacturing an embedded circuit board 200. The method is provided by way of example, as there are a variety of ways to carry out the method. The method described below can be carried out using the configurations shown in FIGS. 11-15, for example, and various elements of these figures are referenced in explaining the method. Each block shown in FIG. 10 represents one or more processes, methods, or subroutines, carried out in the method. Furthermore, the order of blocks is illustrative only and can change. Additional blocks can be added or fewer blocks may be utilized, without departing from this disclosure. The example method can begin at block S201 and end at block S205.

The method of the second embodiment is similar to the method of the first embodiment, with a difference being that there is at least one second electronic element 92 adhered onto the second adhesive layer 22.

Figure 11:
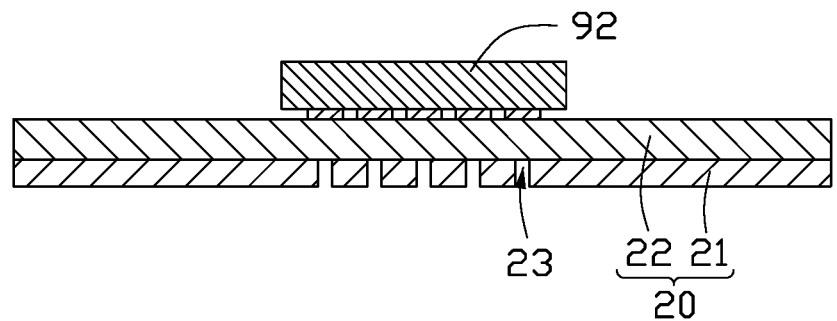
FIG. 11 shows a cross sectional view of a second adhesive coated copper used in the method of manufacturing the embedded circuit board of FIG. 10.

Specifically, at block S202, as shown in FIG. 11, a second adhesive coated copper 20 includes a second copper layer 21 and a second adhesive layer 22. The second copper layer 21 is pre-formed with at least two second positioning holes 23. The second adhesive layer 22 is formed on a surface of the second copper layer 21. At least one second electronic element 92 is adhered to the second adhesive layer 22, and the electrodes of the at least one second electronic element 92 face their corresponding second positioning holes 23.

Fabricating the second adhesive coated copper 20 includes: providing the second copper layer 21 pre-formed with at least two second positioning holes 23; applying colloids on one surface of the second copper layer 21 to form the second adhesive layer 22.

Alternatively, Fabricating the second adhesive coated copper 20 may include: providing the second copper layer 21 pre-formed with at least two second positioning holes 23; providing the semi-cured second adhesive layer 22, and fitting and pressing the second adhesive layer 22 on the second copper layer 21 through pressing.

The second positioning holes 23 can be defined on the second copper layer 21 by an image transfer method. The second positioning holes 23 are used not only for positioning the second electronic element 92 but also for conducting a high density line. The diameter of the second positioning hole 23 is selected according to the size of an electrode of the embedded second electronic element 92. The number of the second positioning holes 23 is equal to the total number of electrodes of the second electronic element 92. After the second electronic element 92 is fixed, each electrode of the second electronic element 92 corresponds to one of the second positioning holes 23. In this embodiment, the number of the second electronic elements 92 is one, and the total number of the electrodes of the second electronic elements 92 is five, and correspondingly, the second copper layer 21 is pre-configured with five first positioning holes 13.

Figure 12:
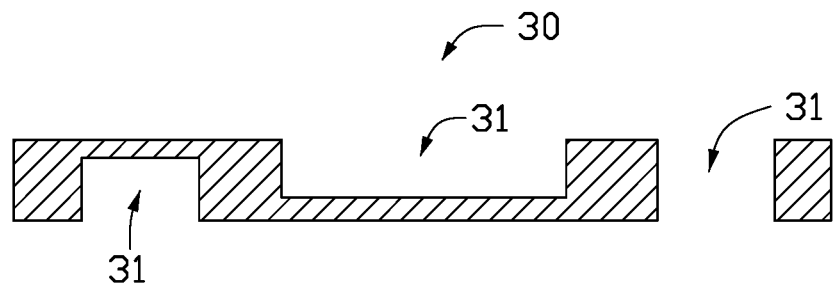
FIG. 12 shows a cross sectional view of a semi-cured film used in the method of manufacturing the embedded circuit board of FIG. 10.
Figure 13:
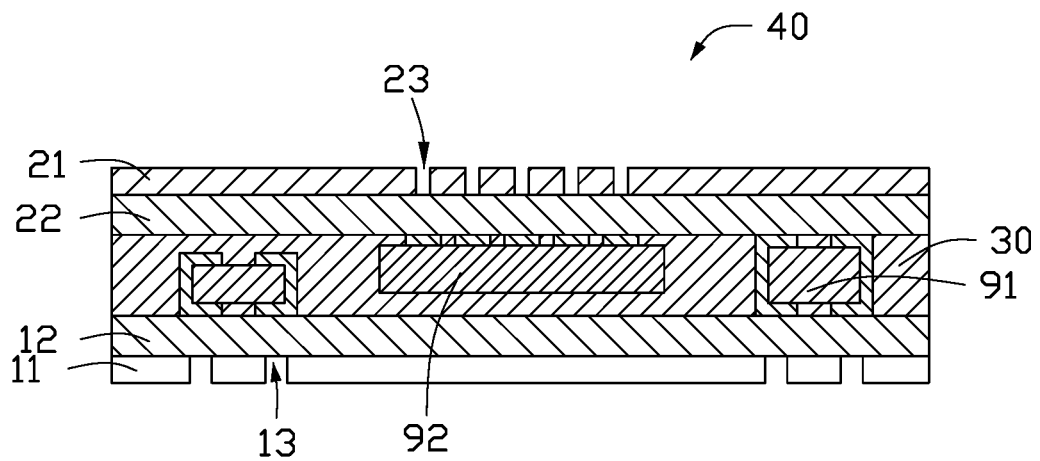
FIG. 13 shows a cross sectional view of an embedded body obtained by fitting the second adhesive coated copper of FIG. 11 and the first adhesive coated copper of FIG. 2 on the semi-cured film of FIG. 12.

At block S203, as shown in FIG. 12 and FIG. 13, a semi-cured film 30 is provided, the first adhesive coated copper 10 and the second adhesive coated copper 20 are pressed on opposite surfaces of the semi-cured film 30, thereby the first electronic elements 91 and the second electronic element 92 being embedded in the semi-cured film 30 to obtain an embedded body 40.

A thickness of the semi-cured film 30 is selected according to an actual thickness of the first electronic element 91 and the second electronic element 92. When the first electronic element 91 and/or the second electronic element 92 is thin, the first adhesive coated copper 10 and/or the second adhesive coated copper 20 are directly pressed on the semi-cured film 30 to embed the first electronic element 91 and/or the second electronic element 92 in the semi-cured film 30. When the thickness of the first electronic element 91 and/or the second electronic element 92 is large, the step S203 further includes: forming at least one groove 31 in the semi-cured film 30 for receiving and embedding the first electronic element 91 and/or the second electronic element 92.

Because the first electronic elements 91 and the second electronic element 92 have different thicknesses, the depths of the grooves 31 are also different. The groove 31 may be a cavity (not penetrating entirely through the semi-cured film 30) or an opening (penetrating entirely through the semi-cured film 30) according to the thickness of the elements to be embedded therein.

During the pressing processes, after the first electronic element 91 and the second electronic element 92 are fixed, the bonding process of the semi-cured film 30 can be controlled for improving a flatness and reducing a thickness of the embedded circuit board 200.

Figure 14:
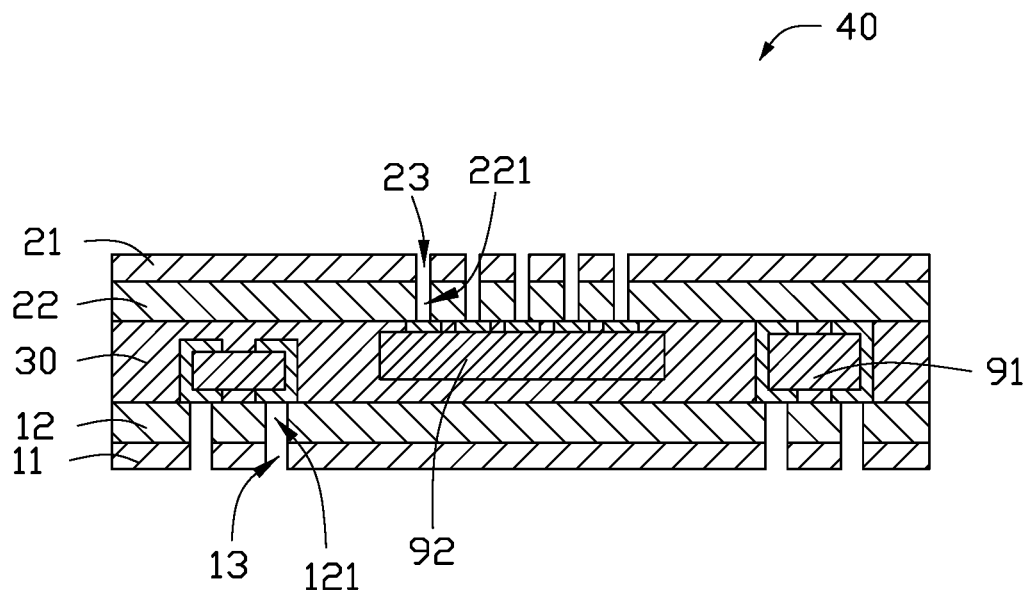
FIG. 14 shows a cross sectional view of the embedded body of FIG. 7, after partially removing a first adhesive layer and a second adhesive layer.

At block S204, as shown in FIG. 14, the first adhesive layer 12 is partially removed to form first holes 121 for exposing electrodes of the first electronic element 91, and the second adhesive layer 22 is partially removed to form second holes 221 for exposing electrodes of the second electronic element 92.

Specifically, portions of the first adhesive layer 12 corresponding in position to to the first positioning holes 13 are laser etched away to expose the electrodes of the first electronic element 91. Similarly, portions of the second adhesive layer 22 corresponding in position to the second positioning holes 23 are laser etched away to expose the electrodes of the second electronic element 93. In other words, each of the first holes 121 face their corresponding first positioning holes 13 and is in communication therewith. Similarly, each of the second holes 221 face their corresponding second positioning holes 23 and is in communication therewith.

Figure 15:
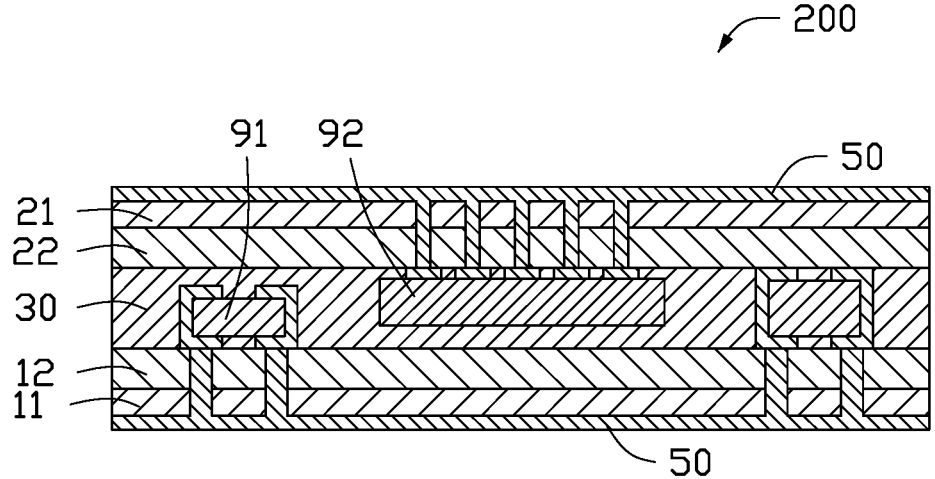
FIG. 15 shows a cross sectional view of the embedded circuit board manufactured using the method in FIG. 10.

At block S205, as shown in FIG. 15, the electrodes of the at least one first electronic element 91 are electrically connected with the first copper layer 11, and the electrodes of the at least one second electronic element 92 are electrically connected with the second copper layer 21.

Specifically, the embedded body 40 is plated to form a plating layer 50 thereon. The plating layer 50 coats the embedded body 40 and fills the first and second holes 121 and 221, and the first and second positioning holes 13 and 23 to achieve an external connection of the embedded circuit board 200.

In FIG. 15, the embedded circuit board 200 of the second embodiment includes a first adhesive coated copper 10, a second adhesive coated copper 20, a semi-cured film 30, and a plating layer 50. The first adhesive coated copper 10 and the second adhesive coated copper 20 are fit on opposite surfaces of the semi-cured film 30 to form an embedded body 40. The plating layer 50 completely coats the embedded body 40.

The first adhesive coated copper 10 includes a first copper layer 11 and a first adhesive layer 12 formed on a surface of the first copper layer 11. The first copper layer 11 is fit on the semi-cured film 30 through the first adhesive layer 12.

At least two first positioning holes 13 are defined on the first copper layer 11. At least one first electronic element 91 is provided and adhered on the first adhesive layer 12. Electrodes of the at least one first electronic element 91 face their corresponding first positioning holes 13.

At least two first holes 121 are defined in the first adhesive layer 12. Each of the first holes 121 faces their corresponding first positioning holes 13 and is in communication therewith, to expose electrodes of the first electronic element 91.

A thickness of the first copper layer 11 is selected according to the copper thickness specification of the line process. In an embodiment, the thickness of the first copper layer 11 is less than or equal to 3 µm.

The first adhesive layer 12 is insulated and made of a viscous resin. The viscous resin of the first adhesive layer 12 may be at least one of Polypropylene, epoxy, polyurethane, phenolic, urea-formaldehyde, melamine-ormaldehyde and polyimide.

The second adhesive coated copper 20 includes a second copper layer 21 and a second adhesive layer 22 formed on a surface of the second copper layer 21. The second copper layer 21 is fit on the semi-cured film 30 by the second adhesive layer 22.

At least two second positioning holes 23 are defined in the second copper layer 21. At least one second electronic element 92 is provided and adhered on the second adhesive layer 22. Electrodes of the at least one second electronic element 92 face their corresponding second positioning holes 23.

At least two second holes 221 are formed in the second adhesive layer 22. Each of the second holes 221 faces their corresponding second positioning holes 23 and is in communication therewith, to expose electrodes of the second electronic element 92.

A thickness of the second copper layer 21 is selected according to the copper thickness specification of the line process. In an embodiment, the thickness of the second copper layer 21 is less than or equal to 3 µm.

The second adhesive layer 22 is insulated and is made of a viscous resin. The viscous resin of the second adhesive layer 22 may be at least one of Polypropylene, epoxy, polyurethane, phenolic, urea-formaldehyde, melamine-ormaldehyde and polyimide. The viscous resin of the second adhesive layer 22 can be the same as the viscous resin of the first adhesive layer 12.

A thickness of the semi-cured film 30 is selected according to an actual thickness of the first electronic element 91. The semi-cured film 30 is made of, but not limited to, polyimide (PI), liquid crystal polymer (LCP), polyethylene terephthalate (PET), or Polyethylene Naphthalate (PEN).

At least one groove 31 is defined in the semi-cured film 30 for receiving and embedding the first electronic element 91 and the second electronic element 92. Because the first electronic elements 91 and the second electronic element 92 have different thickness, the depths of the grooves 31 are also different. The groove 31 may be a cavity (not penetrating entirely through the semi-cured film 30) or an opening (penetrating entirely through the semi-cured film 30) according to the thickness of the elements to be embedded therein.

The plating layer 50 coats the embedded body 40, and fills the first and second holes 121 and 221 and the first and second positioning holes 13 and 23 to achieve an external connection of the embedded circuit board 200.

The embedded circuit board 100 and 200 are suitable for circuit boards with various functions. When the circuit board is subsequently formed, it is only necessary to perform line formation on the plating layer 50 of the embedded circuit board 100/200 according to actual needs. The subsequently-produced lines may be single-layer, double-layer, or multi-layer, which are not described herein.

In other embodiments, the first copper layer 11 and/or the second copper layer 21 may be a circuit substrate. The first positioning holes 13 and/or the second positioning holes 23 may be directly defined in the circuit substrate. The first electronic element 91 and the second electronic element 92 are respectively fixed to inner ends of the first positioning hole 13 and the second positioning hole 23 by adhesive, so that the first positioning hole 13 and the second positioning holes 23 correspond to the electrodes of the first electronic element 91 and the second electronic element 92, respectively.

Figure 16:
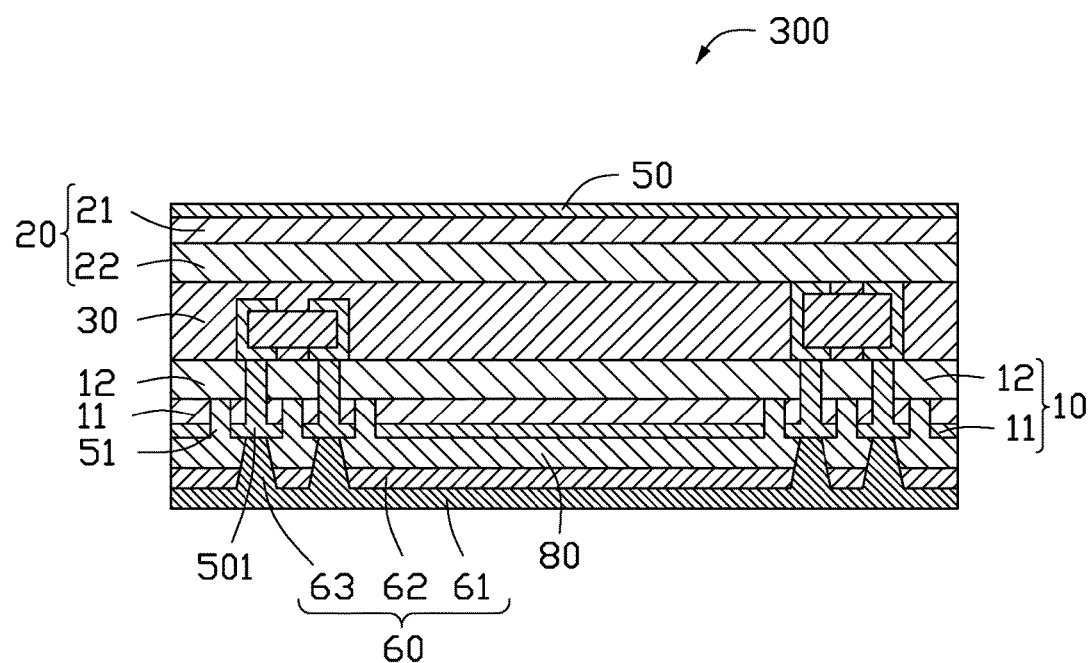
FIG. 16 and FIG. 17 show cross sectional views of a circuit board having the embedded circuit board of the first/second embodiment, respectively.

In FIG. 16, the circuit board 300 of a first embodiment includes the embedded circuit board 100 and a first circuit substrate 60 is built on the plating layer 50 of the embedded circuit board 100.

In this embodiment, the first circuit substrate 60 faces the first adhesive coated copper 10. A plurality of first gaps 51 are defined in the plating layer 50. Each of the first gaps 51 is etched through the plating layer 50 and the first copper layer 11. The first gaps 51 divide the plating layer 50 in a plurality of spaced apart first pads 501, each of which electrically connects with one electrode of the first electronic element 91.

The first circuit substrate 60 is positioned on the first pads 501. In this embodiment, the first circuit substrate 60 is a single-sided wiring board. The first circuit substrate 60 includes a first insulating layer 61 and a first pattern layer 62 formed on the first insulating layer 61. The first insulating layer 61 is fit on the first pads 501 through a bonding layer 80, and the bonding layer 80 also fills the first gaps 51. The first circuit substrate 60 further includes a plurality of first conductive structures 63. The first pattern layer 62 is electrically connected with the first pads 501 through the first conductive structures 63.

The bonding layer 80 is insulated and made of a viscous resin. The viscous resin of the bonding layer 80 may be at least one of Polypropylene, epoxy, polyurethane, phenolic, urea-formaldehyde, melamine-ormaldehyde and polyimide. In an embodiment, the viscous resin of the bonding layer 80 is the same as the viscous resin of the first adhesive layer 12.

In other embodiments, the first circuit substrate 60 can be a double-sided circuit substrate or a multilayer circuit substrate. In other embodiments, a single-layer circuit, a double-layer circuit, or a multilayer circuit may be fabricated on the plating layer 50, which is located on the second copper layer 21.

Figure 17:
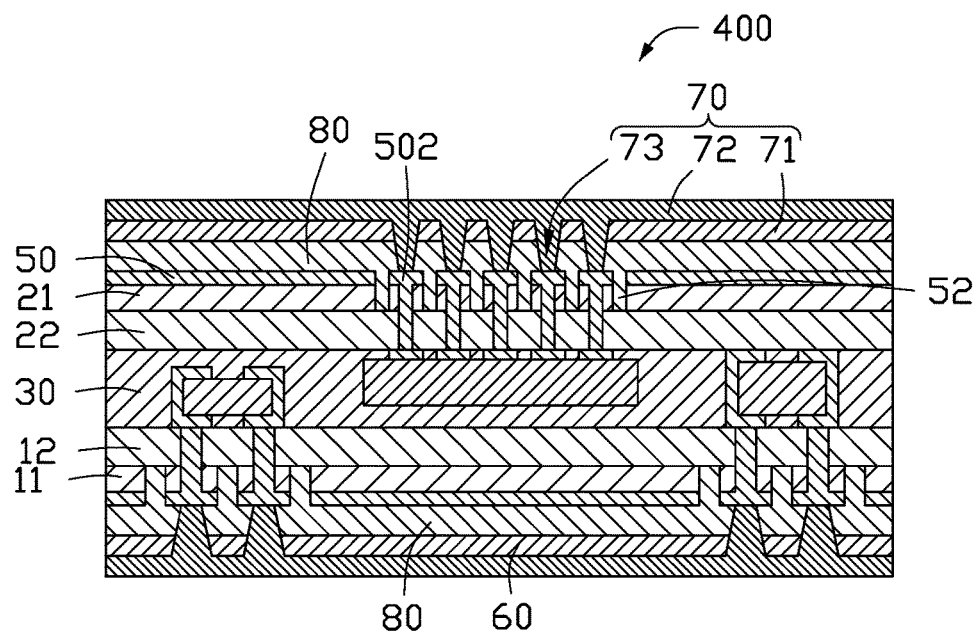

In FIG. 17, the circuit board 400 of a second embodiment includes the embedded circuit board 200, a first circuit substrate 60 and a second circuit substrate 70 are built on the plating layer 50 of the embedded circuit board 200.

A structure of the first circuit substrate 60 in the second embodiment is the same as the structure of the first circuit substrate 60 in the first embodiment.

The second circuit substrate 70 faces the second adhesive coated copper 20.

A plurality of second gaps 52 are defined in the plating layer 50. Each of the second gaps 52 is etched through the plating layer 50 and the second copper layer 21. The second gaps 52 divide the plating layer 50 in a plurality of spaced apart second pads 502, each of which electrically connects with one electrode of the second electronic element 92.

The second circuit substrate 70 is positioned on the second pads 502. In this embodiment, the second circuit substrate 70 is a single-sided wiring board. The second circuit substrate 70 includes a second insulating layer 71 and a second pattern layer 72 formed on the second insulating layer 71. The second insulating layer 71 is fit on the second pads 502 through a bonding layer 80, and the bonding layer 80 also fills the second gaps 52. The second circuit substrate 70 further includes a plurality of second conductive structures 73. The second pattern layer 72 is electrically connected with the second pads 502 through the second conductive structures 73.

In other embodiments, the second circuit substrate 70 can be a double-sided circuit substrate or a multilayer circuit substrate.

The embodiments shown and described above are only examples. Many details are often found in the art. Therefore, many such details are neither shown nor described. Even though numerous characteristics and advantages of the present technology have been set forth in the foregoing description, together with details of the structure and function of the present disclosure, the disclosure is illustrative only, and changes may be made in the details, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A method of manufacturing an embedded circuit board, comprising:
    providing a first adhesive coated copper, the first adhesive coated copper comprising a first copper layer pre-formed with at least two first positioning holes and a first adhesive layer formed on a surface of the first copper layer;
    adhering at least one first electronic element on the first adhesive layer, wherein electrodes of the at least one first electronic element face their corresponding first positioning holes;
    providing a second adhesive coated copper;
    providing a semi-cured film, pressing the first adhesive coated copper and the second adhesive coated copper on opposite surfaces of the semi-cured film, thereby embedding the at least one first electronic element in the semi-cured film;
    partially removing the first adhesive layer to form first holes for exposing electrodes of the at least one first electronic element;
    electrically connecting the electrodes of the at least one first electronic element with the first copper layer.

2. The method of manufacturing the embedded circuit board of claim 1, further comprising: forming at least one groove in the semi-cured film for receiving the at least one first electronic element.

3. The method of manufacturing the embedded circuit board of claim 1, the first adhesive coated copper is fabricated by providing the first copper layer, and applying colloids on one surface of the first copper layer to form the first second adhesive layer.

4. The method of manufacturing the embedded circuit board of claim 1, the first adhesive coated copper is fabricated by providing the first copper layer, providing a semi-cured first adhesive layer, and fitting and pressing the semi-cured first adhesive layer on the first copper layer.

5. A method of manufacturing an embedded circuit board, comprising:
    providing a first adhesive coated copper, the first adhesive coated copper comprising a first copper layer pre-formed with at least two first positioning holes and a first adhesive layer formed on a surface of the first copper layer;
    adhering at least one first electronic element on the first adhesive layer, wherein electrodes of the at least one first electronic element face their corresponding first positioning holes;
    providing a second adhesive coated copper comprising a second copper layer pre-formed with at least two second positioning holes and a second adhesive layer formed on a surface of the second copper layer;
    adhering at least one second electronic element on the second adhesive layer, wherein electrodes of the at least one second electronic element face their corresponding second positioning holes;
    providing a semi-cured film, pressing the first adhesive coated copper and the second adhesive coated copper on opposite surfaces of the semi-cured film, thereby embedding the at least one first electronic element and the at least one second electronic element in the semi-cured film;
    partially removing the first adhesive layer to form first holes for exposing electrodes of the at least one first electronic element, and partially removing the second adhesive layer to form second holes for exposing electrodes of the at least one second electronic element;
    electrically connecting the electrodes of the at least one first electronic element with the first copper layer, and electrically connecting the electrodes of the at least one second electronic element with the second copper layer.

6. The method of manufacturing the embedded circuit board of claim 5, further comprising: forming at least one groove in the semi-cured film for receiving the at least one first electronic element.

7. The method of manufacturing the embedded circuit board of claim 5, the first adhesive coated copper is fabricated by providing the first copper layer, and applying colloids on one surface of the first copper layer to form the first second adhesive layer.

8. The method of manufacturing the embedded circuit board of claim 5, the first adhesive coated copper is fabricated by providing the first copper layer, providing a semi-cured first adhesive layer, and fitting and pressing the semi-cured first adhesive layer on the first copper layer.

9. The method of manufacturing the embedded circuit board of claim 5, the second adhesive coated copper is fabricated by providing the second copper layer, and applying colloids on one surface of the second copper layer to form the second adhesive layer.

10. The method of manufacturing the embedded circuit board of claim 5, the second adhesive coated copper is fabricated by providing the second copper layer, providing a semi-cured second adhesive layer, and fitting and pressing the semi-cured second adhesive layer on the second copper layer.

11. A circuit board, comprising:
a first adhesive coated copper comprising:
a first copper layer pre-formed with at least two first positioning holes; and
a first adhesive layer formed on a surface of the first copper layer;
a second adhesive coated copper;
a semi-cured film, the first adhesive coated copper and the second adhesive coated copper fit on opposite surfaces of the semi-cured film to form an embedded body; and
a plating layer completely coating the embedded body;
wherein the first copper layer is fit on the semi-cured film through the first adhesive layer, at least one first electronic element adhered on the first adhesive layer and embedded in the semi-cured film, electrodes of the at least one first electronic element face their corresponding first positioning holes; at least two first holes are defined on the first adhesive layer, each of the first holes face their corresponding first positioning holes and is in communication therewith; the plating layer fills the first holes and the first positioning holes to connect with the electrodes of the at least one first electronic element.

12. The circuit board of claim 11, wherein at least one groove is defined on the semi-cured film for receiving the at least one first electronic element.

13. The circuit board of claim 11, wherein the second adhesive coated copper comprises:
a second copper layer; and
a second adhesive layer formed on a surface of the second copper layer;
wherein the second copper layer is fit on the semi-cured film through the second adhesive layer.

14. The circuit board of claim 13, wherein the second copper layer having at least two second positioning holes pre-formed thereon, at least one second electronic element is adhered on the second adhesive layer and embedded in the semi-cured film, electrodes of the at least one second electronic element respectively face their corresponding second positioning holes; at least two second holes are formed in the second adhesive layer, each of the second holes face their corresponding second positioning holes and is in communication therewith; the plating layer fills the second holes and the second positioning holes to connect with the electrodes of the at least one second electronic element.

15. The circuit board of claim 11, further comprising a first circuit substrate built on the plating layer, wherein a plurality of first gaps are defined on the plating layer, each of the first gaps passes through the plating layer and the first copper layer, the first gaps divide the plating layer in a plurality of spaced apart first pads, each of which electrically connects with one electrode of the at least one first electronic element, the first circuit substrate is positioned on the first pads and electronically connected with the first pads.

16. The circuit board of claim 14, further comprising a second circuit substrate built on the plating layer; wherein a plurality of second gaps are defined on the plating layer, each of the second gaps passes through the plating layer and the second copper layer, the second gaps divide the plating layer in a plurality of spaced apart second pads, each of which electrically connects with one electrode of the at least one second electronic element, the second circuit substrate is fit on the second pads and electronically connected with the second pads.

* * * * *